(12) United States Patent
Kuo et al.

(10) Patent No.: US 7,375,561 B2
(45) Date of Patent: May 20, 2008

(54) TIMING ADJUSTMENT CIRCUIT AND METHOD THEREOF

(75) Inventors: Hung-Yi Kuo, Hsin-Tien (TW); Hui-Mei Chen, Hsin-Tien (TW)

(73) Assignee: Via Technologies Inc., Taipei County (TW)

( * ) Notice: Subject to any disclaimer, the term of this patent is extended or adjusted under 35 U.S.C. 154(b) by 73 days.

(21) Appl. No.: 11/515,850

(22) Filed: Sep. 6, 2006

(65) Prior Publication Data

US 2007/0057710 A1 Mar. 15, 2007

(30) Foreign Application Priority Data

Sep. 9, 2005 (TW) ............................... 94131185 A

(51) Int. Cl.
*H03L 7/00* (2006.01)

(52) U.S. Cl. ...................................... 327/144

(58) Field of Classification Search ................ 327/144, 327/146, 147, 149, 150, 152, 155, 156, 158, 327/159, 292, 293, 294, 295, 296
See application file for complete search history.

(56) References Cited

U.S. PATENT DOCUMENTS 5,278,873 A * 1/1994 Lowrey et al. ............. 375/371
6,870,415 B2 * 3/2005 Zhang et al. ............... 327/274

* cited by examiner

*Primary Examiner*—Jeffrey Zweizig
(74) *Attorney, Agent, or Firm*—Rosenberg, Klein & Lee

(57) ABSTRACT

A timing adjustment circuit and method thereof are disclosed. The timing adjustment circuit at least consists of a second timing adjustment unit, a multistage sample circuit, and a decision circuit for adjusting received timing of an output signal transmitted by a first chip and received by a second chip. The method takes advantage of the multistage sample circuit to receive a clock signal of receiving end so as to generate a plurality of sample clock signal. Later, according to the sample clock signals, sample output signals to generate a plurality of sampled signal. At last, make comparison of the sampled signals by the decision circuit in accordance with the output signals to generate a second adjustment signal being transmitted to the second timing adjustment unit for adjusting phase of a base clock to generate an adjusted receiving-end clock signal. Thus the receiving timing of the second chip to receive the output signal is adjusted. Moreover, the decision circuit sends a first adjustment signal to a first timing adjustment unit of the timing adjustment circuit for generating an adjusted output-end clock signal. Thus the output timing that the first chip transmits the output signal to the second chip is adjusted.

17 Claims, 4 Drawing Sheets

TIMING ADJUSTMENT CIRCUIT AND METHOD THEREOF

BACKGROUND OF THE INVENTION

The present invention relates to an adjustment circuit and method thereof, especially to a timing adjustment circuit and method thereof for adjusting timing of transmitting signal as well as timing of receiving signal between chips so as to achieve precise signal transmission between chips and higher reliability of computer system.

Most technical products available now are getting more powerful with compact volume and light weight. This is the result of chips with small size and enhanced performance. Due to high precision of chips, the signal transmission between chips is easy to get interference so that the signal transmission between chips as well as chip performance is also influenced. In order to provide more powerful functions, a single product generally integrates a plurality of chips, such as north bridge and south bridge, on motherboard. Therefore, precise signal transmission becomes one of the major research focuses on development of further technology products.

During signal transmission process between two chips, the chip outputting signal needs an output-end clock signal as output timing for transmitting signal to another chip while the chip receiving signal takes a receiving-end clock signal as receiving timing for receiving signal. Different circuit boards have different wiring layouts, so that chips disposed on different circuit boards have different dispositions. Thus timing of signal transmission between two chips is influenced. Therefore, it is necessary to adjust and match output and receiving timing of chips while arranging chips on circuit boards. The timing adjustment methods available now takes the time, cost and labors in trail and error. That is the technical personnel need to repeat various tests and measurements for adjusting receiving or output timing. However, it's timing consuming and labor intensive. Moreover, the receiving or output timing may not be adjusted to the ideal values due to human errors and thus the signal transmission between chips is unstable.

Moreover, even the receiving and output timing of chips have been adjusted before the circuit boards going out, the wiring and chips on the circuit boards may still be influenced by external factors such as temperature and dust. And further the timing as well as accuracy of signal transmission between chips is affected. In addition, the values of the receiving and output timing are fixed and are difficult to change. Therefore, the reliability of computer system has been influenced.

In order to overcome above problems, the present invention provides a timing adjustment circuit and method thereof that adjust the receiving and output timing automatically. Thus not only human errors caused by manual adjustment are excluded, but also the adjusting time is reduced. The accuracy of adjustment is enhanced for precise signal transmission between chips.

SUMMARY OF THE INVENTION

It is a primary object of the present invention to provide a timing adjustment circuit and method thereof that generate a plurality of sample clock signal by a multistage sample circuit to sample output signals of chips to generate a plurality of sampled signal. Finally, make comparison of the sampled signals to judge whether the received signals have errors or not. According to the comparison result, the receiving-end clock signal or output-end clock signal is adjusted to achieve the precise adjustment of receiving timing and output timing of chips as well as accurate signal transmission between two chips.

A timing adjustment circuit and method thereof in accordance with the present invention are used for adjusting the receiving timing that a second chip receives an output signal transmitted from a first chip. The timing adjustment circuit of the present invention includes a timing adjustment unit that receives a base clock and generates a receiving-end clock signal. According to the receiving-end clock signal, the second chip receives the output signal form the first chip. The timing adjustment method at least consist the following steps. Firstly, receive the receiving-end clock signal by a multistage sample circuit to generate a plurality of sample clock signal. Then according to the sample clock signals, sample output signals to produce a plurality of sampled signal that is transmitted to a decision circuit. The decision circuit makes comparison of the sampled signals in accordance with the output signals to generate an adjustment signal being transmitted to the timing adjustment unit. Thus the timing adjustment unit is driven to adjust phase of the base clock to generate an adjusted receiving-end clock signal. Thus the receiving timing that the second chip receives the output signal from the first chip is adjusted. Therefore, the second chip precisely receives the output signal transmitted from the first chip.

The present invention provides another timing adjustment circuit and method thereof that are applied to adjust output timing that a first chip transmits an output signal to a second chip. The timing adjustment circuit at least consists of a timing adjustment unit, a multistage sample circuit, and a decision circuit. The timing adjustment unit is for receiving a base clock, adjusting phase of the base clock, and generating an output-end clock signal so that the first chip transmits the output signal to the second chip according to the output-end clock signal. The adjusting method uses the multistage sample circuit to receive a receiving-end clock signal to generate a plurality of sample clock signal. Then according to the sample clock signals, sample output signal to produce a plurality of sampled signal. By the decision circuit, compare the sampled signals in accordance with the output signal to generate an adjustment signal being transmitted to the timing adjustment unit. Thus the timing adjustment unit is driven to adjust phase of the base clock to generate an adjusted output-end clock signal. Thus the output timing that the first chip transmits the output signal to the second chip is adjusted. Therefore, the first chip precisely sends the output signal to the second chip.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

Figure 1:
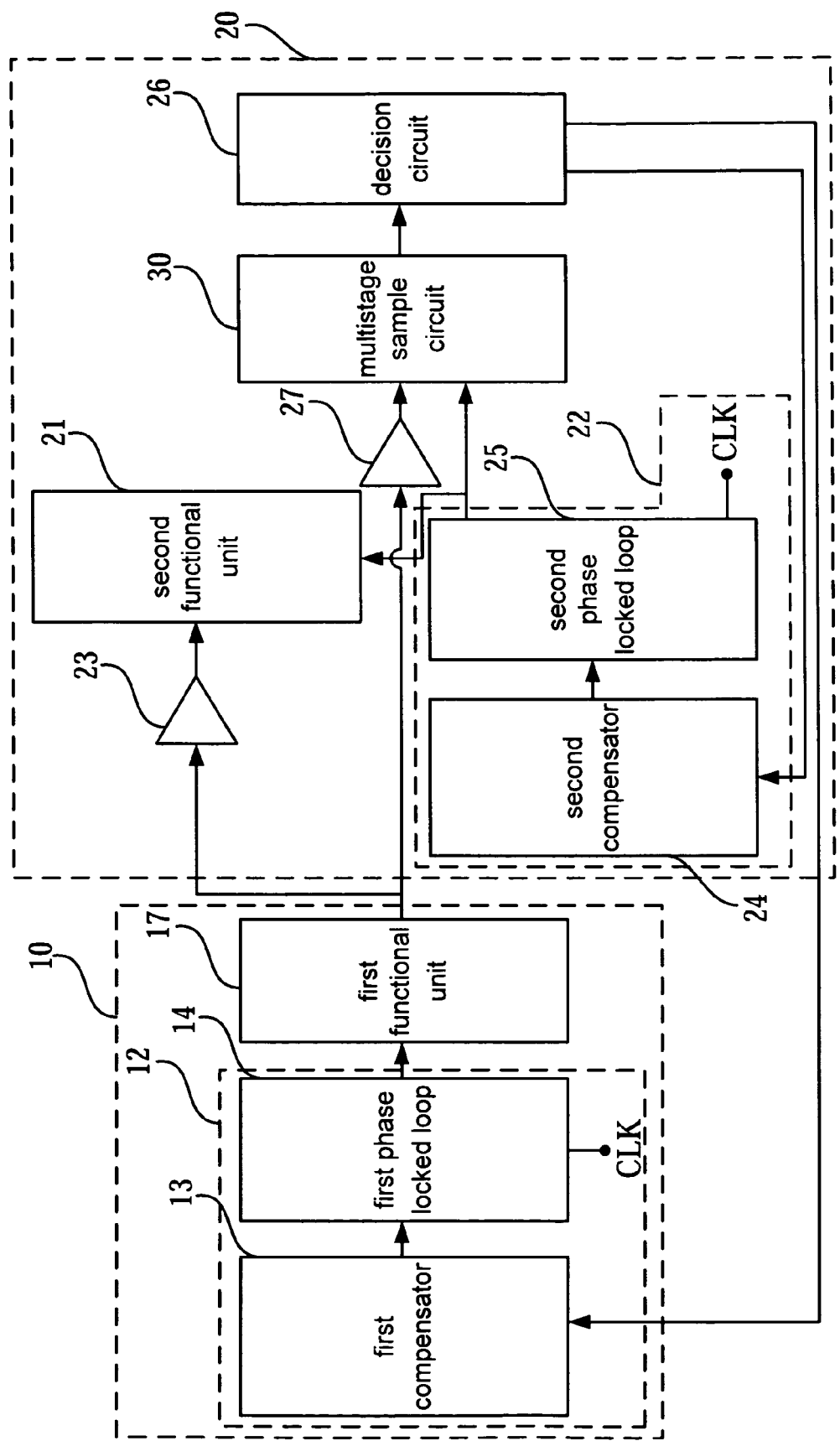
FIG. 1 is a block diagram of an embodiment in accordance with the present invention.

Referring to FIG. 1, which is the block diagram of an embodiment in accordance with the present invention. Before normal operation of a first chip 10 and a second chip 20, the embodiment adjusts timing in advance. More particularly, the receiving timing of an output signal transmitted from the first chip 10 and received by the second chip 20, and output timing of the output signal transmitted from the first chip 10 to the second chip 20 are adjusted in advance. So the adjustments make the signal transmission between the first chip 10 and the second chip 20 be precise after running of chips 10, 20. The first chip 10 is composed of a first timing adjustment unit 12 and a first functional unit 17. By receiving a base clock (CLK), the first timing adjustment unit 12 generates an output-end clock signal. According to the clock signal of the first timing adjustment unit 12, the first functional unit 17 transmits an output signal to a second functional unit 21 of the second chip 20. The first timing adjustment unit 12 at least consists of a first compensator 13 and a first phase locked loop 14. In accordance with a first adjustment signal, the first compensator 13 produces a first phase adjustment signal that is transmitted to the first phase locked loop 14. Thus the first phase locked loop 14 adjusts phase of the received base clock and generates the output-end clock signal.

The second chip 20 includes a second functional unit 21 and a second timing adjustment unit 22. After receiving the base clock, the second timing adjustment unit 22 generates a receiving-end clock signal that is transmitted to the second functional unit 21. According to the receiving-end clock signal, the second functional unit 21 receives the output signal from the first functional unit 17. A buffer 23 is disposed between the first functional unit 17 and the second functional unit 21 for storage the output signal temporarily. The second timing adjustment unit 22 includes a second compensator 24 and a second phase locked loop 25. The second compensator 24 produces a second phase adjustment signal according to a second adjustment signal and then the second phase adjustment signal is transmitted to the second phase locked loop 25. Thus the second phase locked loop 25 adjusts phase of the received base clock according to the second phase adjustment signal and generates a receiving-end clock signal.

Moreover, the second chip 20 further includes a multistage sample circuit 30 and a decision circuit 26. According to the receiving-end clock signal from the second timing adjustment unit 22, the multistage sample circuit 30 produces a plurality of sample clock signal. Thus according to the sample clock signals, sample the output signals from the first functional unit 17 to generate a plurality of sampled signal. The decision circuit 26 receives the sampled signals, and makes comparison of the sampled signals in accordance with the output signals from the first functional unit 17 for outputting the second adjustment signal to the second timing adjustment unit 22 or transmitting the first adjustment signal to the first timing adjustment unit 12 so as to adjust the receiving-end clock signal or the output-end clock signal. Because the present invention is for adjusting timing before normal operation of the first chip 10 and the second chip 20, the embodiment drives the first chip 10 to transmit a preset output signal for timing adjustment before beginning of operation while the output signal of the decision circuit 26 for deciding the sampled signals is also an output signal present in the decision circuit 26.

Therefore, by adjusting the receiving timing that the second functional unit 21 receives the output signal from the first functional unit 17 or by adjusting the output timing that the first functional unit 17 transmits the output signal to the second functional unit 21, the signal transmission between the first functional unit 17 and the second functional unit 21 is assured precisely. A buffer 27 is further disposed between the first functional unit 17 and the multistage sample circuit 30 for storage the output signal from the first functional unit 17 temporarily.

Figure 2:
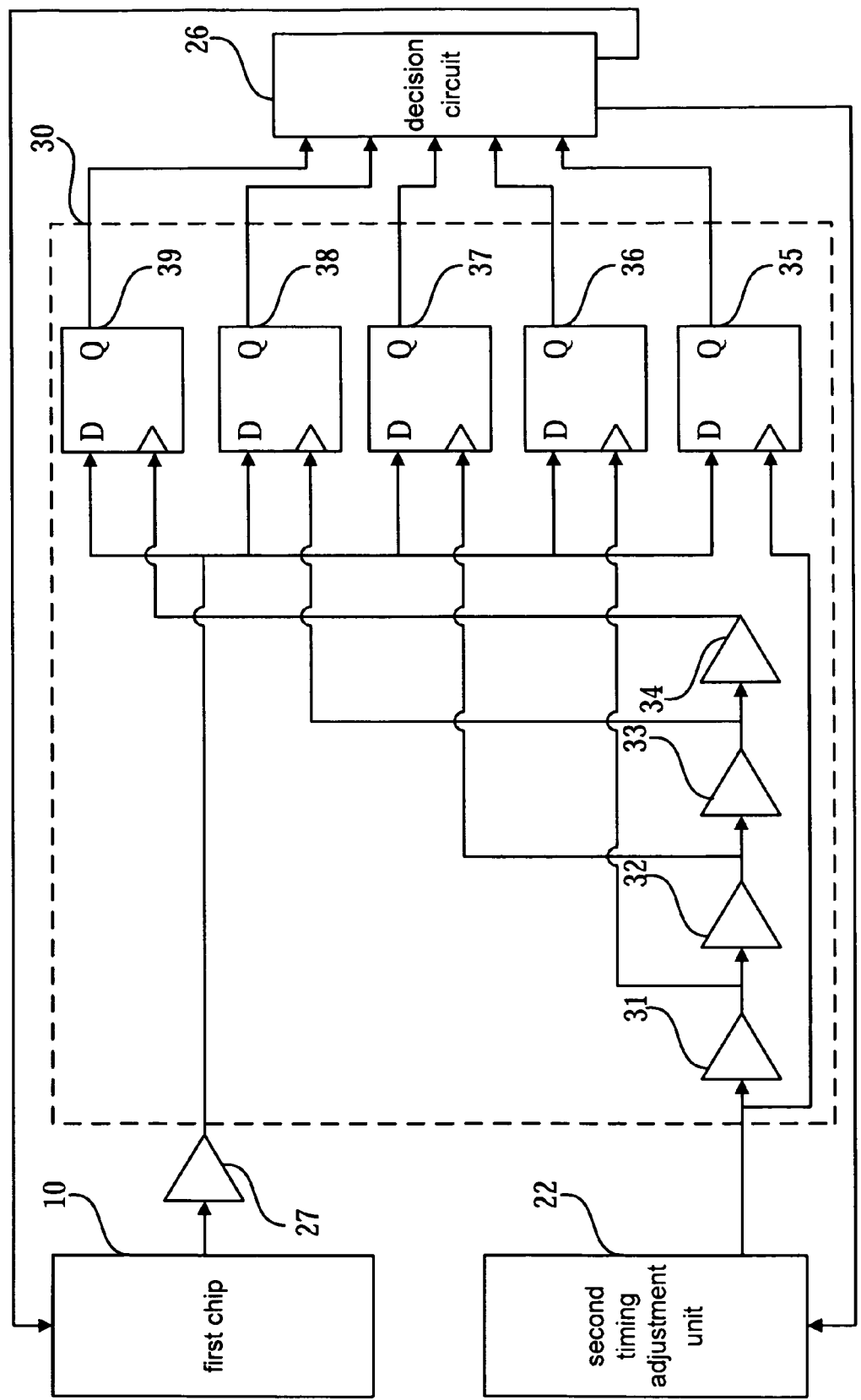
FIG. 2 is a circuit diagram of a multistage sample circuit of an embodiment in accordance with the present invention.

Refer to FIG. 2, the multistage sample circuit 30 of the embodiment in accordance with the present invention at least consists of a plurality of buffer and latch. The number of the buffer as well as latch depends on the amount of signal intends to be sampled from the output signal. In this embodiment, it is taken as an example that five signals are intended to be sampled from the output signals. The buffers, such as a first buffer 31, a second buffer 32, a third buffer 33 and a fourth buffer 34, are connected with each other in series. A plurality of latch includes a first latch 35, a second latch 36, a third latch 37, a fourth latch 38 and a fifth latch 39.

The first buffer 31 receives the receiving-end clock signal generated by the second phase locked loop 25 of the second timing adjustment unit 22 for delaying the output of the receiving-end clock signal and generating a second sample clock signal while the second buffer 32 receives the second sample clock signal for delaying the output of the second sample clock signal and generating a third sample clock signal, and so on. The third buffer 33 and the fourth buffer 34 generate a fourth sample clock signal and a fifth sample clock signal respectively. The first sample clock signal is the receiving-end clock signal produced by the second phase locked loop 25 of the second timing adjustment unit 22.

The first latch 35, a second latch 36, a third latch 37, a fourth latch 38 and a fifth latch 39 all receive the output signal that is temporarily saved in the buffer 27 and is transmitted from the first functional unit of the first chip 10. According to the received first sample clock signal, the second sample clock signal, the third sample clock signal, the fourth sample clock signal, and the fifth sample clock signal, each of the latches 35, 36, 37, 38 and 39 produce a first sampled signal, a second sampled signal, a third sampled signal, a fourth sampled signal, and the fifth sampled signal respectively, and all the sampled signals are sent into the decision circuit 26. In accordance with the preset output signal, the decision circuit 26 compares the sampled signals respectively so as to generate a second adjustment signal being transmitted to the second compensator 24 or a first adjustment signal being transmitted to a first compensator 13 for adjusting the receiving timing of the second functional unit 21 or the output timing of the first functional unit 17. Before operation of the first chip 10 and the second chip 20, the timing adjustment is executed previously. Thus the first functional unit 17 sends the preset output signal to the second functional unit 21 while the decision circuit 26 compares the sampled signals in accordance with the preset output signal to generate the adjustment signals.

The multistage sample circuit 30 and the decision circuit 26 of the embodiment judge whether the output signal received by the second chip 20 is correct or not to generate adjustment signals for adjusting the output timing of the first chip 10 and the receiving timing of the second chip 20 into the most proper timing. Thus the signals between the first chip 10 and the second chip 20 are transmitted precisely. The method for adjusting timing is described as following:

It is assumed that the preset output signal sent out by the first functional unit 17 is "1", which is a high-level signal in one clock cycle. While the latches 39, 38, 37, 36, 35 of the multistage sample circuit 30 sample the output signals according to the sample clock signals from the fifth to the first. The sampled signals from the fifth to the first are assumed to be (1, 1, 1, 0, 0) respectively, the decision circuit 26 compares the sampled signals according to the output signal that is preset as "1" to generate the second adjustment signal being transmitted to the second compensator 24. The second adjustment signal drives the second compensator 24 to generate a second phase adjustment signal that makes a phase shift to the right while the second phase adjustment signal is sent to the second phase locked loop 25. Then, the second phase locked loop 25 adjusts the base clock to have a phase shift to the right, and generates an adjusted receiving-end clock signal according to the second phase adjustment signal.

The sampled signals of the adjusted receiving-end clock signal, sampling through the latches 39, 38, 37, 36, and 35 are assumed to be (1, 1, 1, 1, 0). The decision circuit 26 compares the sampled signals according to the preset output signal and generates a second adjustment signal with a phase shift to the right again. The second adjustment signal drives the second timing adjustment unit 22 to adjust the receiving-end clock signal successively. When the sampled signals are (1,1,1,1,1), it is a safe condition of receiving-end clock signal for data transmission between the first functional unit 17 and the second functional unit 21. It is to learn that the decision circuit 26 sends a second adjustment signal to the second timing adjustment unit 22 according to this safe condition and the second timing adjustment unit 22 is driven to adjust the receiving-end clock signal to the best timing. For example, the decision circuit 26 sends a second adjustment signal, that has two phases shift to the left, to the second timing adjustment unit 22. The third sample clock signal acts as a preferred receiving-end clock signal of the second functional unit 21 of the second chip 20 for signal transmissions. Thus even the signal transmission process between the first chip 10 and the second chip 20 is influenced by external factors, the accuracy of signal transmission can still be assured.

For another example, it is assumed that the decision circuit 26 sending a second adjustment signal that has a phase shift to the right when the sampled signals are assumed to be (1, 1, 1, 0, 0). Through the second timing adjustment unit 22, an adjusted receiving-end clock signal is generated. And the following sampled signals of the latches 39, 38, 37, 36, 35 are (0, 1, 1, 1, 0, which is a safe condition of the receiving-end clock signal. According to the sampled signals are within the safe conditions, the decision circuit 26 determines and adjusts the receiving-end clock signal of the second control unit 21 so as to achieve precise signal transmission between the first chip 10 and the second chip 20.

For another example, when the first sampled signals of the latches 39, 38, 37, 36, 35 are (0, 0, 0, 1, 1), then the decision circuit 26 compares the preset output signal "1" and the sampled signals, and generates the second adjustment with a phase shift to the left to the second timing adjustment unit 22 for generating an adjusted receiving-end clock signal. Then the decision circuit 26 adjusts the adjusted receiving-end clock signal depending on its own safe conditions. On the other hand, a first adjustment signal is generated according to the comparison result of the decision circuit 26 and is sent to the first timing adjustment unit 12 of the first chip 10 when the receiving-end clock signal of the second timing adjustment unit 22 is fixed. In the similar adjusting way of above description, the first timing adjustment unit 12 is driven to generate an adjusted output-end clock signal to assure accuracy of signal transmission between the first chip 10 and the second chip 20.

Figure 3:
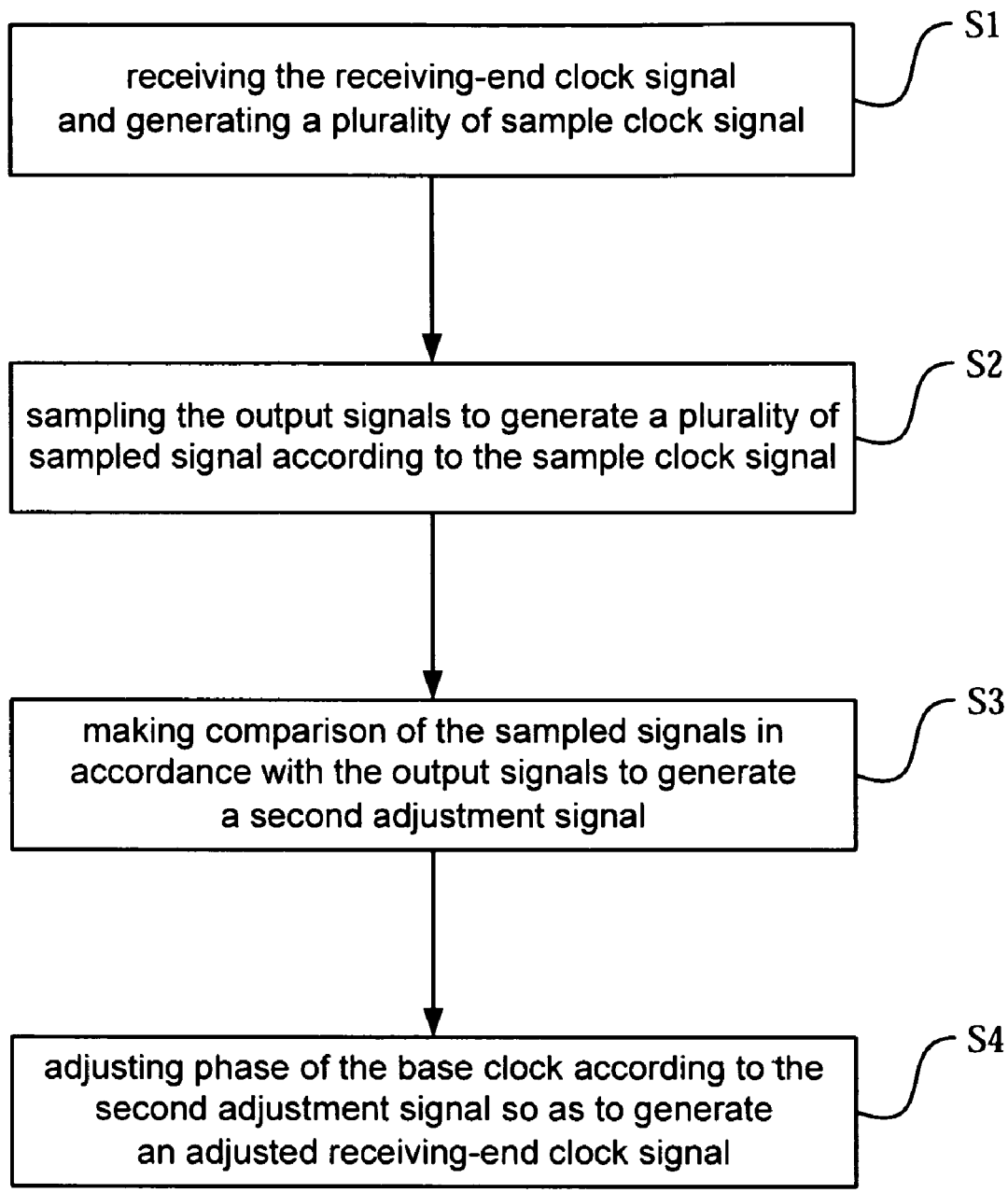
FIG. 3 is a flow chart for adjusting receiving timing in accordance with the present invention.

Refer to FIG. 3, a flow chart for adjusting receiving timing in accordance with the present invention. In order to adjust the receiving timing of the second chip 20 which receives output signals transmitted from the first chip 10, the multistage sample circuit 30 receives the receiving-end clock signal and generates a plurality of sample clock signal, as shown in step S1. Then, as shown in step S2, sample the output signals that the first chip 10 transmits to the second chip 20 according to the sample clock signal so as to generate a plurality of sampled signal that is transmitted to the decision circuit 26. Next, the decision circuit 26 takes the step S3, make comparison of the sampled signals in accordance with the output signals to generate a second adjustment signal and send the second adjustment signal to the second timing adjustment unit 22.

Finally, the second timing adjustment unit 22 runs the step S4, adjust phase of the base clock according to the second adjustment signal so as to generate an adjusted receiving-end clock signal. Thus the receiving timing of the second functional unit 32 of the second chip 20 to receive the output signal is adjusted.

Figure 4:
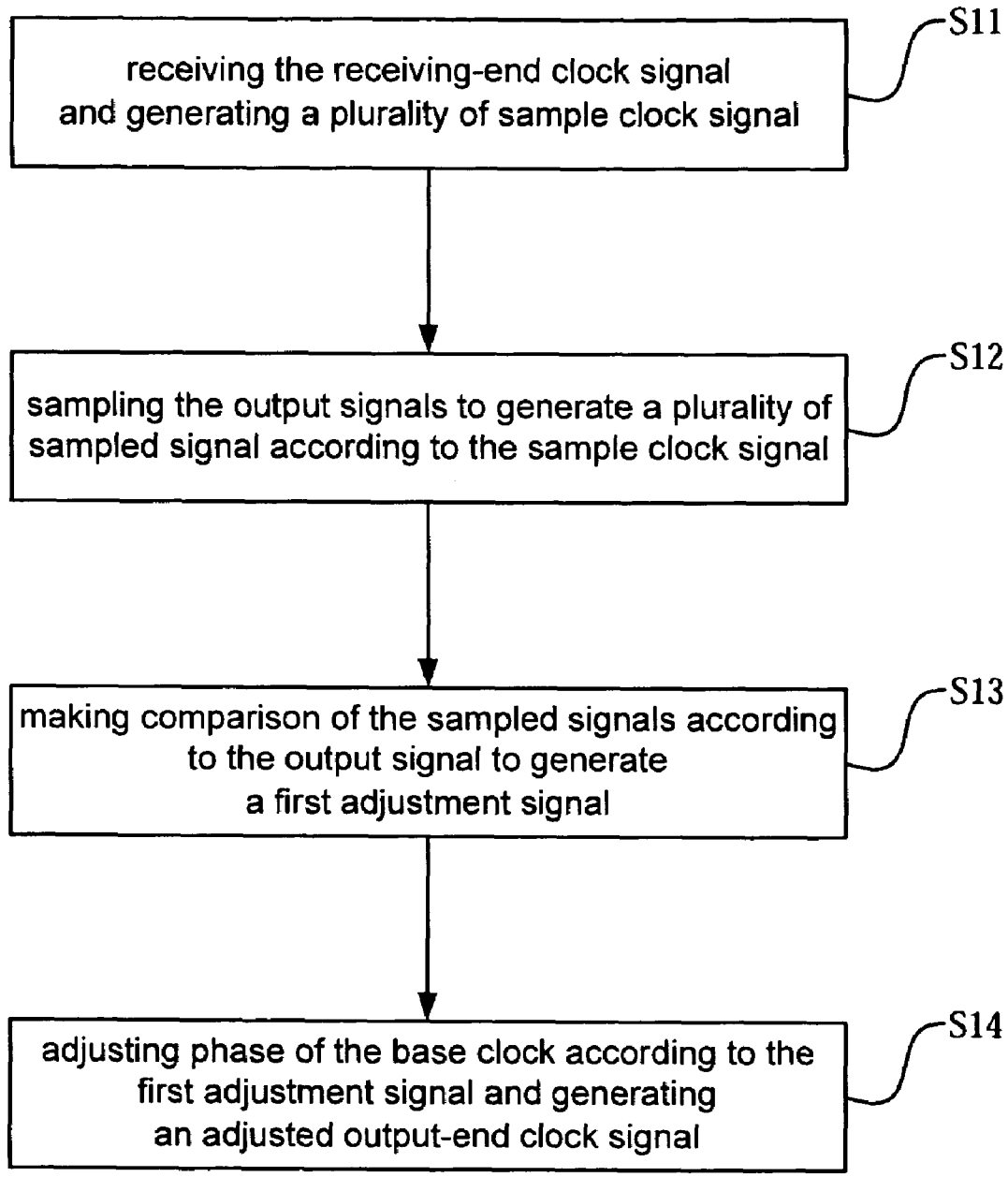
FIG. 4 is a flow chart for adjusting output timing in accordance with the present invention.

With reference of FIG. 4, while adjusting output timing of the first chip 10 to transmit the output signals to the second chip 20, the multistage sample circuit 30 takes the step S11 and the step S12 that are the same with the step S1 and S2 in above embodiment. Then, as shown in step S13, the decision circuit 26 makes comparison of the sampled signals according to the output signal to generate a first adjustment signal and the first adjustment signal is sent to the first timing adjustment unit 12. Thus the first timing adjustment unit 12 is driven to execute the step S14, adjust phase of the base clock according to the first adjustment signal and generate an adjusted output-end clock signal so that the output timing of the output signal transmitted by the first functional unit 17 is adjusted.

In summary, a timing adjustment circuit and method thereof in accordance with the present invention is applied to adjust timing of signal transmission between two chips so as to achieve precise signal transmission. A multistage sample circuit of the present invention receives the receiving-end clock signal to generate a plurality of sample clock signal and thus sample the preset output signal that the first chip transmits t the second chip according to the sample clock signal. The sampled signals are produced and then are sent to the decision circuit so that the decision circuit compares the sampled signals in accordance with the preset output signal to generate a second adjustment signal or a first adjustment signal for adjusting the receiving timing of the second chip or the output timing of the first chip. Thus the accuracy of signal transmission between two chips is assured and time for adjusting timing of two chips is reduced. Therefore, the efficiency of timing adjustment is improved.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A timing adjustment circuit applied to adjust receiving timing of an output signal transmitted from a first chip and received by a second chip comprising:

a timing adjustment unit for receiving a base clock, adjusting phase of the base clock, and generating a receiving-end clock signal while a second functional unit of the second chip receiving the output signal transmitted from a first functional unit of the first chip according to the receiving-end clock signal;

a multistage sample circuit receiving the receiving-end clock signal to generate a plurality of sample clock signal and then sample the output signals according to the sample clock signals to produce a plurality of sampled signal; and a decision circuit receiving the sampled signals and making comparison of the sampled signals in accordance with the output signal to generate a second adjustment signal, wherein the second adjustment signal is transmitted to the timing adjustment unit for adjusting phase of the base clock and generating an adjusted receiving-end clock signal so as to adjust the receiving timing of the output signal received by the second functional unit.

2. The circuit as claimed in claim 1, wherein the timing adjustment unit comprising a second compensator generating a second phase adjustment signal according to the second adjustment signal; and a second phase locked loop receiving the base clock and adjusting phase of the base clock according to the second phase adjustment signal for generating the adjusted receiving-end clock signal.

3. The circuit as claimed in claim 1, wherein the multistage sample circuit comprising a plurality of buffer connected with each other in series for receiving the receiving-end clock signal to generate the sample clock signals; and a plurality of latch receiving the output signal and the sample clock signals respectively, and sampling the output signal according to the sample clock signals to generate the sampled signals.

4. The circuit as claimed in claim 1, wherein a buffer for temporarily storage the output signal is disposed between the first functional unit and the second functional unit.

5. The circuit as claimed in claim 1, wherein a buffer for temporarily storage the output signal is disposed between the first functional unit and the multistage sample circuit.

6. The circuit as claimed in claim 1, wherein the timing adjustment unit, the multistage sample circuit, and the decision circuit are disposed on the second chip.

7. A timing adjustment circuit applied to adjust output timing that a first chip transmits an output signal to a second chip comprising:

a timing adjustment unit for receiving a base clock, adjusting phase of the base clock, and generating an output-end clock signal while a first functional unit of the first chip transmitting the output signal into a second functional unit of the second chip according to the output-end clock signal;

a multistage sample circuit receiving a receiving-end clock signal to generate a plurality of sample clock signal and then according to the sample clock signals, sample the output signals to produce a plurality of sampled signal; and a decision circuit receiving the sampled signals and making comparison of the sampled signals in accordance with the output signal to generate a first adjustment signal being transmitted to the timing adjustment unit for adjusting phase of the base clock and generating an adjusted output-end clock signal so as to adjust the output timing of the output signal transmitted by the first functional unit.

8. The circuit as claimed in claim 7, wherein the timing adjustment unit comprising:

a first compensator generating a first phase adjustment signal according to the first adjustment signal; and a first phase locked loop receiving the base clock and adjusting phase of the base clock according to the first phase adjustment signal for generating the adjusted output-end clock signal.

9. The circuit as claimed in claim 7, wherein the multistage sample circuit comprising a plurality of buffer connected with each other in series for receiving the receiving-end clock signal to generate the sample clock signals; and a plurality of latch receiving the output signal and the sample clock signals respectively, and sampling the output signal according to the sample clock signals to generate the sampled signals.

10. The circuit as claimed in claim 7, wherein a buffer for temporarily storage the output signal is disposed between the first functional unit and the second functional unit.

11. The circuit as claimed in claim 7, wherein a buffer for temporarily storage the output signal is disposed between the first functional unit and the multistage sample circuit.

12. The circuit as claimed in claim 7, wherein the multistage sample circuit, and the decision circuit are disposed on the second chip while the timing adjustment unit is arranged on the first chip.

13. A timing adjustment method, applied to adjust output timing or receiving timing that a first chip transmits an output signal to a second chip while a first functional unit of the first chip transmits the output signal to a second functional unit of the second chip, comprising the steps of:

receiving a receiving-end clock signal to generate a plurality of sample clock signal;

sampling the output signal to produce a plurality of sampled signal according to the sample clock signals;

comparing the sampled signals in accordance with the output signal to generate an adjustment signal; and adjusting phase of a base clock according to the adjustment signal.

14. The method as claimed in claim 13, wherein the step of adjusting phase of a base clock according to the adjustment signal is to generate an adjusted receiving-end clock signal for adjusting the receiving timing that the second chip receives the output signal.

15. The method as claimed in claim 14, wherein the step of adjusting phase of a base clock according to the adjustment signal to generate the adjusted receiving-end clock signal further comprising the steps of:

generating a second phase adjustment signal according to the adjustment signal; and adjusting phase of the base clock according to the second phase adjustment signal to generate the adjusted receiving-end clock signal.

16. The method as claimed in claim 13, wherein the step of adjusting phase of a base clock according to the adjustment signal is to generate an adjusted output-end clock signal for adjusting the output timing that the first chip transmits the output signal.

17. The method as claimed in claim 16, wherein the step of adjusting phase of a base clock according to the adjustment signal to generate the adjusted output-end clock signal further comprising the steps of:

generating a first phase adjustment signal according to the adjustment signal; and adjusting phase of the base clock according to the first phase adjustment signal to generate the adjusted output-end clock signal.

* * * * *